United States Patent [19]

Roberts et al.

[11] Patent Number: 4,627,379

[45] Date of Patent: Dec. 9, 1986

[54] SHUTTER APPARATUS FOR FINE-TUNING A COUPLED-DUAL RESONATOR CRYSTAL

[75] Inventors: Gerald E. Roberts, Lynchburg; Samuel Toliver, Rustburg, both of Va.

[73] Assignee: General Electric Company, Schenectady, N.Y.

[21] Appl. No.: 676,124

[22] Filed: Nov. 29, 1984

[51] Int. Cl.$^4$ .................................. C23C 13/08
[52] U.S. Cl. .................... 118/721; 118/720; 118/504; 118/505; 427/100
[58] Field of Search ............... 118/720, 721, 504, 505; 427/100

[56] References Cited

U.S. PATENT DOCUMENTS

| | | | |
|---|---|---|---|
| 2,432,950 | 12/1947 | Turner et al. | 118/720 |
| 2,571,167 | 10/1951 | Ruggles et al. | 118/505 |
| 2,765,765 | 10/1956 | Bigler et al. | 118/728 |
| 2,906,235 | 9/1959 | Hirsh | 118/8 |
| 2,978,364 | 4/1961 | Blaustein | 427/10 |
| 3,063,867 | 11/1962 | Emery, Jr. | 427/10 |
| 3,117,025 | 1/1964 | Learn et al. | 118/720 |
| 3,352,282 | 11/1967 | Schweitzer | 118/721 |
| 3,371,138 | 2/1968 | Zablocki | 118/504 X |
| 3,502,051 | 3/1970 | Adams | 118/720 |
| 3,504,325 | 3/1970 | Rairden, III | 338/160 |
| 3,549,414 | 12/1970 | Curran et al. | 117/212 |
| 3,573,672 | 4/1971 | Fair | 333/72 |
| 3,600,675 | 8/1971 | Grenier | 324/57 R |
| 3,670,693 | 6/1972 | Rorick et al. | 118/5 |
| 3,756,851 | 9/1973 | Remick et al. | 117/201 |
| 3,773,541 | 11/1973 | Ng et al. | 427/10 |
| 3,866,155 | 2/1975 | Kobayashi et al. | 333/72 |
| 3,963,982 | 6/1976 | Roberts | 324/56 |
| 3,992,760 | 11/1976 | Roberts | 29/25.35 |
| 4,093,914 | 6/1978 | Peppiatt et al. | 324/56 |
| 4,107,349 | 8/1978 | Vig | 427/36 |
| 4,122,147 | 9/1978 | Thompson | 427/100 |
| 4,323,031 | 4/1982 | Kaplan | 118/720 |
| 4,343,827 | 8/1982 | Thompson | 427/8 |
| 4,378,382 | 3/1983 | Behn | 118/720 X |
| 4,391,034 | 7/1983 | Stuby | 29/579 |

FOREIGN PATENT DOCUMENTS 95950 7/1980 Japan .................................. 427/100

Primary Examiner—Richard Bueker
Attorney, Agent, or Firm—M. Masnik; Robert C. Lampe, Jr.

[57] ABSTRACT

A system for plating resonator electrodes or the like by the vapor deposition process employs one or more shutters between the deposition material source and a plating mask. At least one of the shutters has a pair of apertures aligned with different apertures in the plating mark. In one embodiment comprising a two shutter, four position system, the two shutters may be positioned such that either, both or neither of the resonators can be plated. Because each shutter is either ON or OFF, a simple binary analogy for control of the shutters results.

13 Claims, 18 Drawing Figures

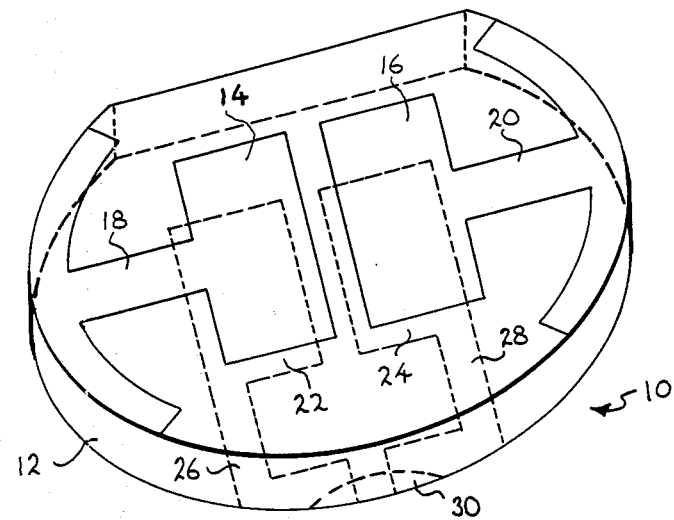
FIG.1
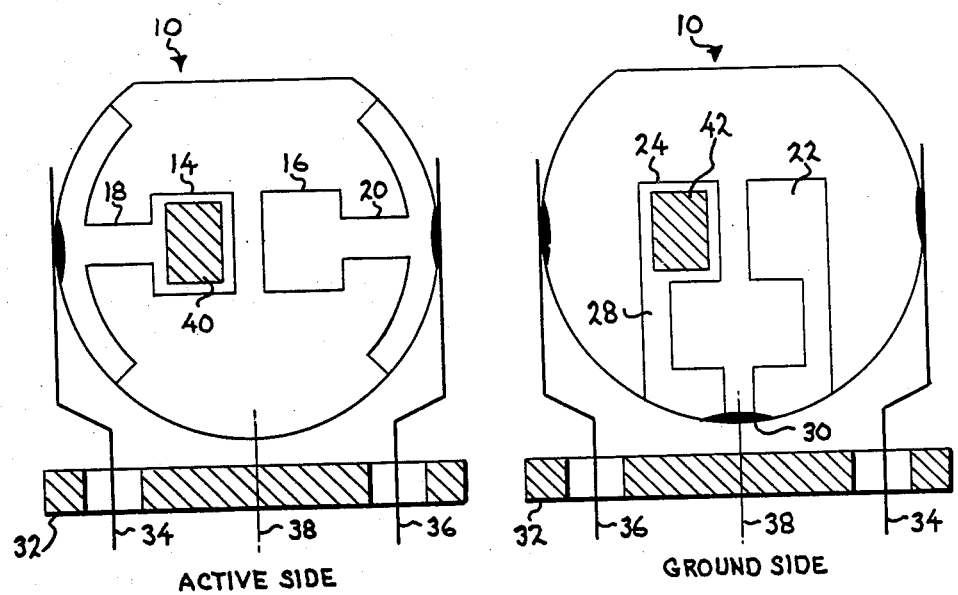
ACTIVE SIDE
FIG.2A
GROUND SIDE
FIG.2B

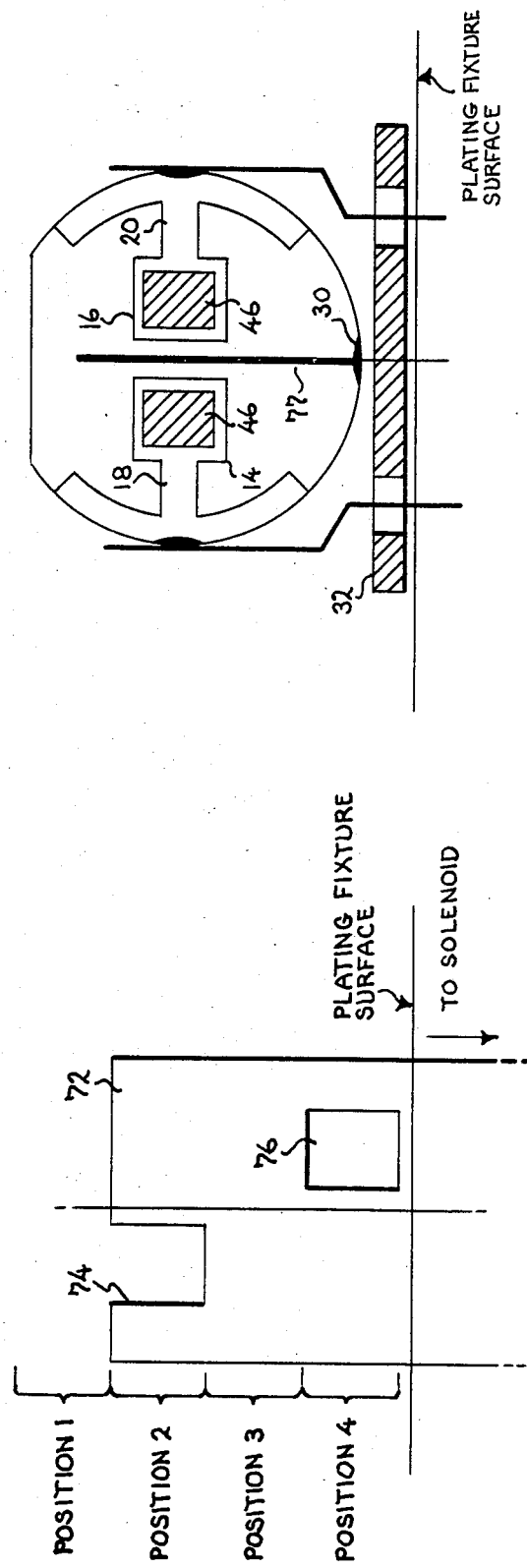

| SHUTTER POSITION | SHUTTER APERTURES | | DECIMAL VALUE | PLATING ACTION |
|---|---|---|---|---|
| | LEFT | RIGHT | | |
| 1 | 1 | 1 | 3 | PLATE BOTH RESONATORS |
| 2 | 1 | 0 | 2 | PLATE A - RESONATOR |
| 3 | 0 | 1 | 1 | PLATE B - RESONATOR |
| 4 | 0 | 0 | 0 | STOP PLATING |

| APERTURE STATUS | | | | COMPOSITE | | DECIMAL VALUE | PLATING ACTION |
|---|---|---|---|---|---|---|---|
| SHUTTER POSITION | 1ST SHUTTER | | 2ND SHUTTER | A RESONATOR | B RESONATOR | | |
| | LEFT | RIGHT | | | | | |
| 1 | 1 | 0 | 1 | 1 | 0 | 2 | PLATE A-RESONATOR |
| 2 | 0 | 1 | 1 | 0 | 1 | 1 | PLATE B-RESONATOR |
| 3 | X | X | 0 | 0 | 0 | 0 | STOP PLATING |

APERTURE STATUS
0 = CLOSED
1 = OPEN
X = DOESN'T MATTER

FIG.11B

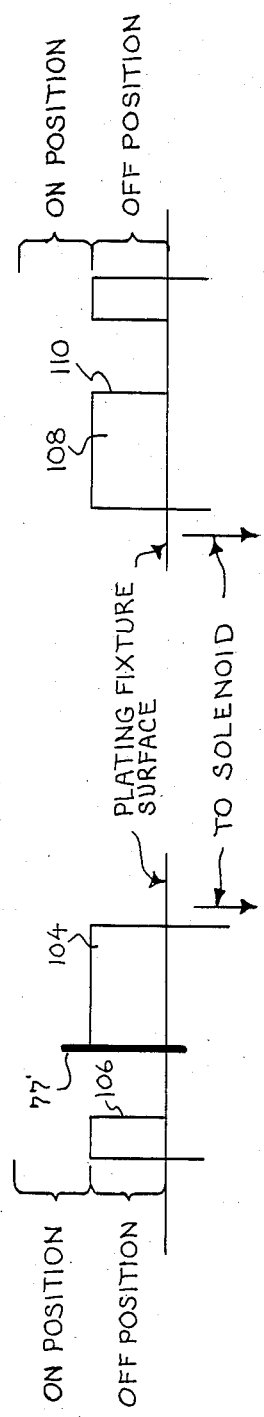

SHUTTER APPARATUS FOR FINE-TUNING A COUPLED-DUAL RESONATOR CRYSTAL

BACKGROUND OF THE INVENTION

Our invention relates to a novel shutter apparatus for use in fine tuning a coupled-dual resonator crystal and, more particularly, for selectively controlling the plating of the resonators of a coupled-resonator crystal.

Crystal filters are used extensively in radio and electronic circuits. Dual or two-resonator crystal filters are preferred in many applications because they provide the characteristics of a very narrow bandpass filter or part of a very narrow filter, due to the extremely high Q of the associated resonator crystals, in a relatively small size. Such very narrow filter characteristics are virtually impossible or extremely difficult to realize with lumped devices, such as inductors or capacitors.

A typical dual resonator crystal filter includes a wafer of piezoelectric material having two or more pairs of electrodes formed on the wafer. The mass loading of each pair of electrodes (one on each side forming a resonator) determines in part the resonant frequency of that resonator. Coupling between the pair of electrodes forming the input resonator and the pair of electrodes forming the output resonator is determined in part by the effective separation between the resonators. A coupling strip may be positioned on one face of the piezoelectric material between the input and output electrodes to reduce the effective separation and thus increase coupling.

The three major characteristics of the coupled-dual crystal which are controllable during its fabrication process and which are primary determinants of the filtering characteristics of the corresponding filter are the resonator frequencies of the input and output resonators and the synchronous peak separation frequency (SPSF). Synchronous peak separation frequency is a measure of coupling and has been defined in U.S. Pat. No. 4,093,914, which is assigned to the same assignee as the present invention and incorporated herein by reference, as the absolute value of the difference between the two short circuit resonant frequencies that would occur if the two resonators were tuned to the same resonant frequency.

As taught by U.S. Pat. No. 4,093,914, the significance of synchronous peak separation frequency is that it can provide a common reference value at a particular point in the process of tuning a specific crystal for evaluating the acoustic coupling of that crystal. It has meaning in that it represents a value or number which can be related mathematically to the coupling capacitor in the equivalent circuit of the crystal. It also provides a convenient measure of a specific crystal's coupling capability, as related to the nominal design, independent of the actual variations in resonator frequencies of the crystal. The value of the synchronous peak separation frequency is that it provides a means for controlling or monitoring the fabrication of crystals of a specific coupled-dual crystal design by mathematically relating the acoustic coupling of each crystal to standard or common conditions. It represents, in essence, a "coupling parameter" which can be used and calculated at any point in the fabrication process regardless of whether or not the two resonators are equal in frequency. It can be distinguished from the filter resonator coupling of Thompson (U.S. Pat. No. 4,343,827) which is associated with balanced open circuit resonant frequencies. By using synchronous peak separation frequency instead of Thompson's filter resonator coupling, we have a coupling parameter which we can use anywhere in the tuning process regardless of whether or not the resonator frequencies are equal. Thus, we use synchronous peak separation frequency in our process and, as used hereinafter, the terms "resonator coupling", "coupling parameter" and "coupling" refer to synchronous peak separation frequency (or SPSF).

The prior art teaches that coupling and the center or mean frequency (the arithmetic mean of the two resonator frequencies) can be adjusted or "tuned" by adding mass to the electrodes of the resonators to decrease their respective frequencies. The problem is that the method and apparatus for controlling the amount of plating on the various components have proven inadequate. Typically, the resonators are plated in a vacuum chamber in which a piece of metal, such as high purity silver, is vaporized and deposited on the resonator electrodes. Control of the location and duration of the plating is critical. In the typical system the resonators are masked to expose only the portion of the resonator to be plated, thus fixing the location of the plating. As for the duration, in some systems the amount of deposition is controlled simply by controlling the amount of plating metal vaporized. This is generally inadequate for the fine-tuning required in many applications because it is difficult to stop the vaporization process at precisely the right moment to insure the desired frequency in the plated resonator. This is because of the tendency of the vaporization apparatus to overrun slightly when its control circuits are turned off.

There are several other known ways to control the plating process. One approach is to vary the deposition rate from an initial high rate to a lower rate as the resonator frequency approaches the target frequency. Such an approach is taught in U.S. Pat. No. 3,670,693, by Rorick et al. Another approach is to interject a shutter system between the vaporization source and the object to be plated to abruptly terminate the plating process such as taught by U.S. Pat. No. 2,432,950, Turner et al. Yet another approach is to abruptly release the vacuum and inject an inert gas into the vaporization chamber as taught in U.S. Pat. No. 4,112,134 to Buynak et al. The shutter system seems to be the most easily controllable, but previous systems suffered from mechanical complexity within the vacuum apparatus. This is compounded when multiple elements are to be plated through multiple masks requiring multiple shutters. This requires the use of elaborate control systems.

SUMMARY OF THE INVENTION

Accordingly, it is the primary object of the present invention to provide a system for plating resonator electrodes in which the deposition process is completely terminated when the desired resonator frequency is obtained.

It is another object of the present invention to provide a simple shutter system for controlling, in a vapor deposition process, the amount of plating at a plurality of resonator locations.

It is yet another object of the present invention to provide a rapid acting, accurate method for controlling the amount of vapor deposition onto resonator crystals to regulate the fine tuning thereof.

These, and other objects and advantages, will be more clearly understood from the following detailed descriptions, the drawings and specific examples, all of which are intended to be typical of, rather than in any way limiting on the scope of the present invention.

Briefly stated, the above objectives are accomplished in a binary shutter system employing one or more shutters between the vaporization source and a plating mask. At least one of the shutters has a pair of apertures, each of which may be aligned with an aperture in a plating mask associated with one of the resonators. In a two shutter system, the two shutters have two operative positions in which either, both or neither of the resonators can be plated. The exact order in which these various operational modes are accessable may be varied. Since in each operational mode each shutter is either ON or OFF with respect to a particular resonator to be plated, a simple binary analogy for control of the shutters results.

BRIEF DESCRIPTION OF THE DRAWINGS

While the specification concludes with claims particularly pointing out and distinctly claiming the subject matter which is regarded as part of the present invention, it is believed that the invention will be more fully understood from the following description of the preferred embodiments which are given by way of example with the accompanying drawings in which:

FIG. 1 is a simplified perspective view of a coupled-dual resonator crystal;

FIGS. 2A and 2B depict in schematic form both sides of a mounted coupled-dual resonator crystal;

FIGS. 8A, 8B and 8C depict schematically a binary shutter system, a crystal with which it is used and the associated truth table, respectively;

FIG. 11B is the truth table associated with FIG. 11A; and

FIGS. 12A and 12B are alternative embodiments of FIGS. 8A and 8C, respectively.

DESCRIPTION OF THE PREFERRED EMBODIMENT

Figure 3:
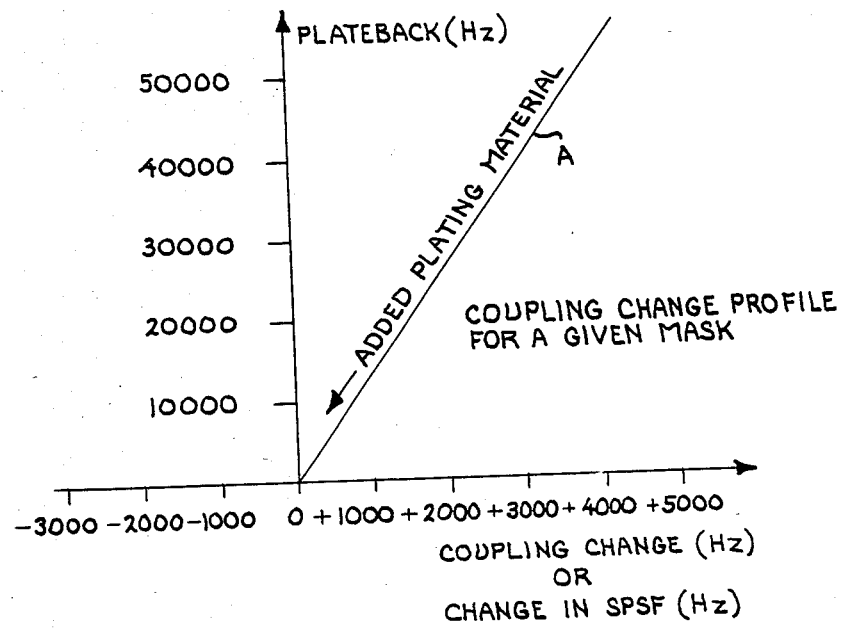
FIG. 3 represents graphically the generally linear relationship between plateback and coupling change for a particular plate mask.

Referring to the drawings wherein like numerals correspond to like elements throughout, attention is first directed to FIG. 1 wherein a coupled-dual resonator crystal filter 10 of the type intended for use with our invention is shown. The filter 10 is formed on a wafer 12 of piezoelectric material such as quartz. A metallic input electrode 14 and an output electrode 16 are applied to the upper or active surface of wafer 12, and electrical connections for these electrodes are provided by leads 18, 20, respectively. Similarly, another input electrode 22 and another output electrode 24 are applied to the lower or grounded surface of wafer 12, with leads 26, 28 providing electric connections therefor. Typically, leads 26, 28 are shorted together as at 30. Opposed input electrodes 14, 22 form an input resonator, whereas opposed output electrodes 16, 24 form an output resonator. Alternating current signals applied to leads 18, 26 cause the piezoelectric material in the input resonator to mechanically vibrate, which vibrations are transmitted to the output resonator, producing voltages which can be derived at leads 20, 28. The piezoelectric material has resonant properties such that only a narrow band of signals is passed between the input leads 18, 26 and the output leads 20, 28. As is well known, the resonant frequency of each of the resonators is determined in part by the mass loading of the material comprising the electrodes, and the shape of the passband is determined in part by the number of resonators. The degree of coupling between the input and output resonators varies as an inverse function of the separation between the input and output electrodes. This effective separation can be decreased (to increase the coupling) by the placement of a coupling strip (not shown) of metal between the electrodes on one side of the wafer as is well known in the art.

One of the most critical operations in the fabrication of a coupled-dual crystal is the final fine-tuning adjustment to put the resonators on the correct frequency and to put the synchronous peak separation frequency on its correct final frequency. The final frequency plating is typically performed in some type of frequency plating machine having a fixture within a vacuum chamber with the crystal being plated under vacuum and with the plating being electronically controlled external to the vacuum chamber. In this regard, see U.S. Pat. Nos. 3,670,693 to Rorick et al and 4,112,134 to Buynak et al for examples of vacuum deposition apparatus. One prior art method of electronic monitoring of the resonator frequencies and SPSF as the plating is selectively deposited onto each resonator is given in U.S. Pat. No. 4,093,914 referenced above. Initially, the coupled-dual resonator crystal is mounted on a crystal base 32 as depicted in FIG. 2. The crystal base is provided with thin wire leads which make contact with the electrode leads, enabling electrical connection to other apparatus. In particular, base lead 34 connects with input electrode lead 18, base lead 36 connects with output electrode lead 20, and base lead 38 connects with shorted electrode leads 26, 28 at 30. Initially, the mounted coupled-dual crystal 10 is inserted into the vacuum fixture making electrical contact between the crystal and an electrical test fixture allowing monitoring of specific crystal parameters during the plating operation.

The material for plating typically comes from high purity silver, gold or aluminum wires suspended upon filament wires running generally parallel to each face of wafer 12 as will be discussed in greater detail later. A precision, non-conducting mask is hung over the wafer exposing all or part of one electrode of each electrode pair forming the input and output resonators. Heretofore, one electrode of each resonator was exposed, the two exposed electrodes being on opposite sides of the wafer. After the vacuum chamber was evacuated, power was applied to the filament via a filament power supply, causing the deposition material, here silver wire, to evaporate onto the unmasked portions of each face of the wafer where frequency plate spots 40, 42 are deposited, thereby increasing electrode mass. The speed at which the silver evaporates was controlled in part by the filament power supply. A shutter system exposes the opening in the mask to plate an electrode as the silver metal on the filament is evaporating.

It has been discovered that not only does the amount of deposited material on the electrodes affect the tuning of the resonator, but the position or location of the added material has an effect as well. In particular, it has been discovered that a given mask which positions frequency plate spots at certain points on the wafer produces its own intrinsic change in coupling (SPSF) as a function of plateback. Plateback is defined as the change in center frequency of the resonators (i.e., the difference between the mean frequency measured at any time in the plating process and the desired final mean frequency) as the crystal is plated to its final frequency. This is illustrated in FIG. 3 in which plateback for a particular mask and particular frequency spot locations is plotted against coupling change (or change in synchronous peak separation frequency) as material is plated on both electrodes 14, 24 of the wafer of FIG. 2. As shown in FIG. 3, the relationship between plateback and coupling change represented by line A is a generally linear one. Said another way, mean frequency and SPSF are reduced in a linear relationship as material is plated on the electrodes. If the frequency plate spots are positioned close to the unelectroded region between resonators, the slope of line A is steeper than when the frequency plate spots are positioned further away from the unelectroded region. Further discussion relating to the relationship between plateback and change in SPSF is found in commonly assigned U.S. patent application Ser. No. 676,125, "Method and Apparatus for Selectively Fine-Tuning a Coupled-Dual Resonator Crystal and Crystal Manufactured Thereby", Roberts et al, filed concurrently with this application, the subject matter of which is incorporated herein by reference.

Figure 4:
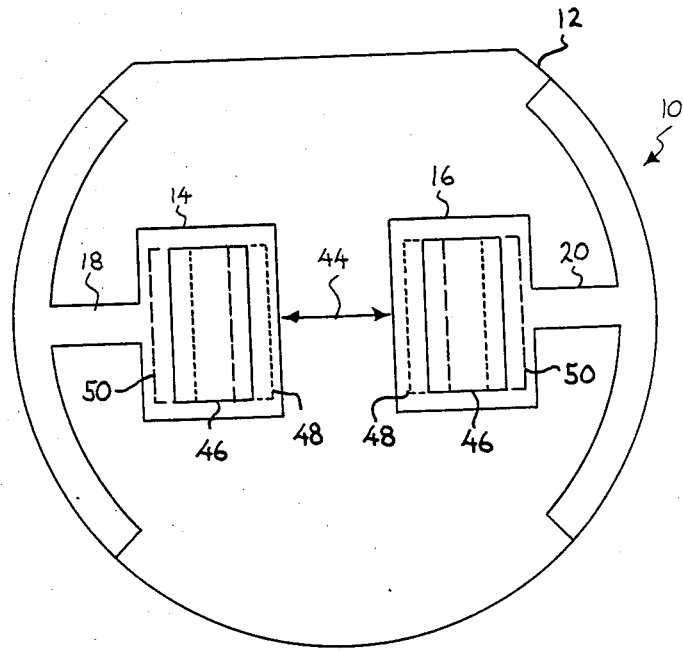
FIG. 4 is a front view of a resonator crystal showing several locations for the frequency plate spots.
Figure 5:
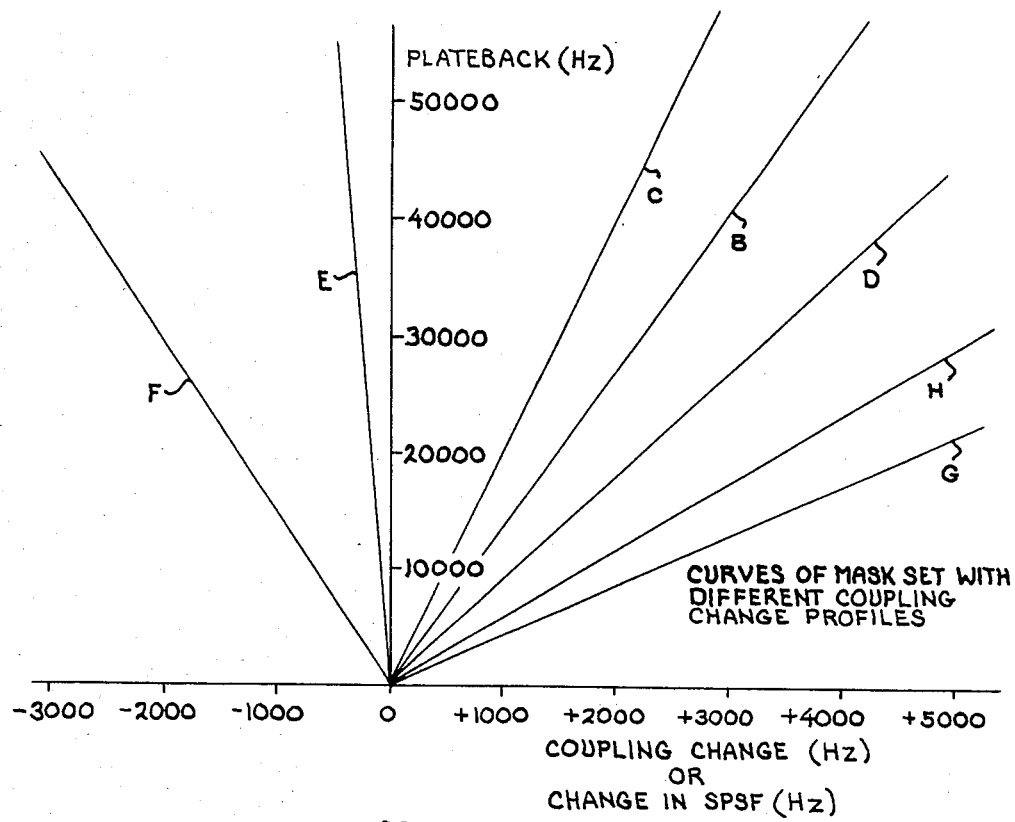
FIG. 5 is similar to FIG. 3 for a plurality of plate masks.

Referring now to FIGS. 4 and 5, a typical wafer 12 having plated resonator electrodes 14, 16 is separated by an unelectroded region denoted generally as 44. In this example, as a pair of frequency plate spots 46 are plated on the same side of the wafer, the corresponding relationship between plateback and coupling change is represented as line B on FIG. 5. As the location of the frequency plate spots are moved closer to the unelectroded region 44 (for example, plate spots 48) the slope of line B tends to become steeper, similar to that represented by line C. Conversely, if the frequency plate spots were located as at 50, the slope would decrease as represented by line D. Thus, a family of curves is possible for a family of masks which vary the location of the frequency plate spots. It is possible that, when the spots are sufficiently close, the slope of the relationship becomes negative as represented by curves E or F in FIG. 5.

Ideally, if a set of masks whose coupling change profiles are such as in FIG. 5 for a given crystal is used, the final frequency-adjusted crystals would be very close to the required final coupling if the initial coordinates (i.e., before final frequency adjust) were known and if the mask with the closest coupling change profile was chosen to final frequency-adjust the specific crystal.

It has also been discovered that the frequency plate spots can both be on the same side of the crystal, or one spot may be on the front side electrode of one resonator and the ground side electrode of the other resonator. Both arrangements produce similar coupling change curves. It has also been discovered that if either or both frequency plate spots is off the original baseplated resonator electrodes, spurious amplitudes are increased dramatically. Therefore, the masks associated with, for example, lines F and G (FIG. 5) must produce spots completely on the crystal resonator electrodes for best results.

Figure 6:
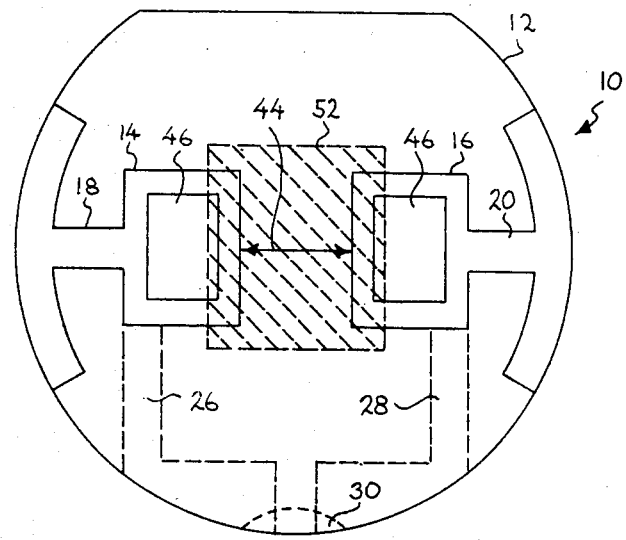
FIG. 6 is similar to FIG. 4 showing the addition of a coupling adjust spot on the ground side.

It has also been discovered that, by making the frequency plate mask such that both frequency adjust spots are on the front or active side of the wafer, one can position a mask opening to deposit a spot (usually rectangular) on the opposite side of the mask to adjust the value of coupling (SPSF). As is best shown in FIG. 6, this mask opening allows a coupling adjust spot 52 to be deposited on the ground side of the crystal, but shadowing the unelectroded region 44 on the active side of the crystal. In addition, the coupling adjust spot should be vertically larger than the vertical dimension of the resonators. It has also been determined that it should shadow the resonator electrodes 14, 16 on the active side by approximately half the unelectroded region's horizontal distance 44 and preferably also overlap each frequency adjust spot 46 on the active side by 1 to 5 mils. In actuality, the determination of overlap (or shadow) distance is based on the resulting spurious levels and is done empirically, but the distances previously recited are representative of crystals we have fine-tuned using this approach.

Figure 7:
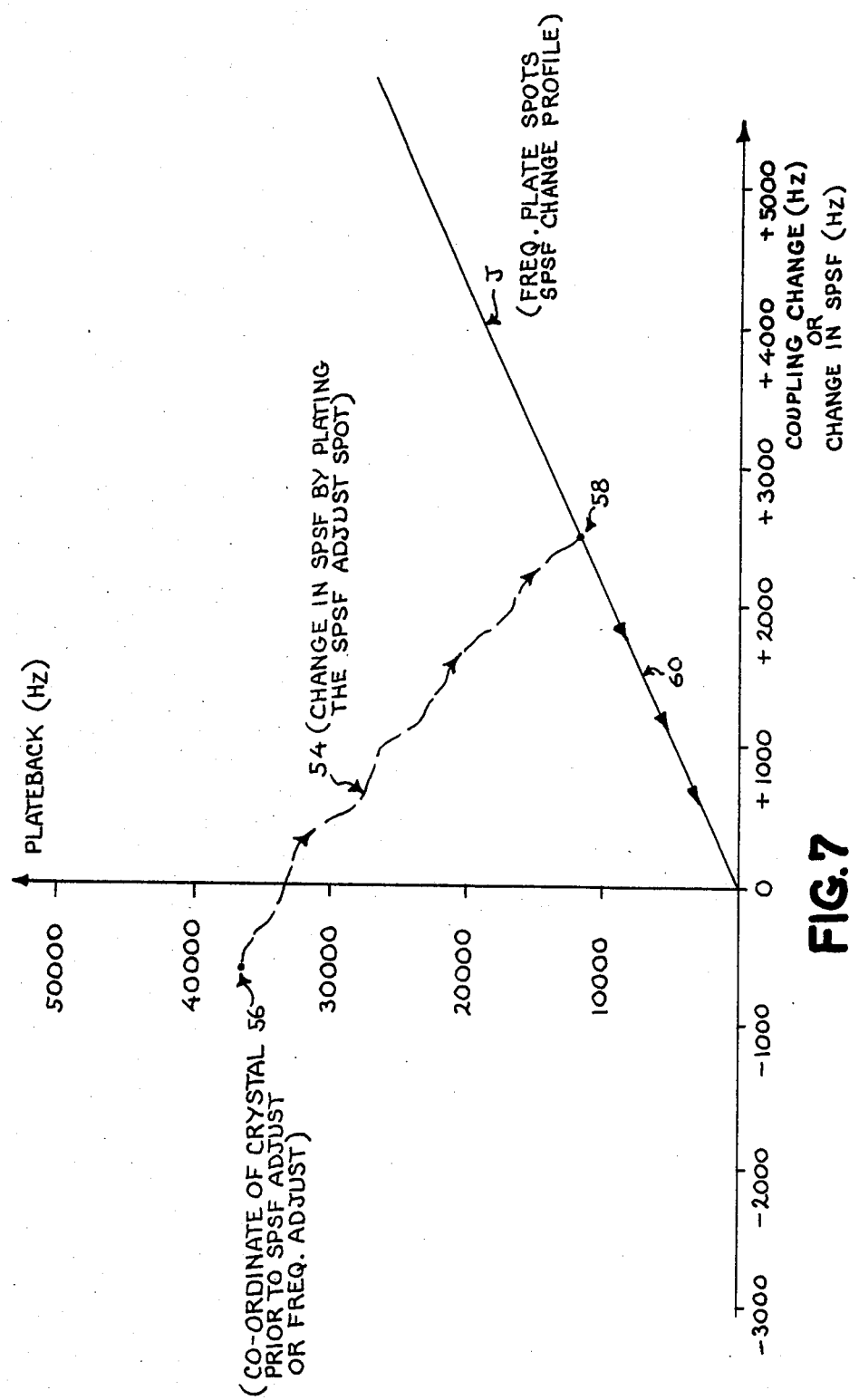
FIG. 7 is similar to FIG. 3 showing graphically the additional effect of the coupling adjust spot on coupling.

As taught in the previously recited copending patent application, a coupling (SPSF) adjust spot used alone on the ground side (i.e., without frequency plate spots on the front or active side) will produce a curve with a negative slope relative to its pre-final frequency adjust coordinates if plotted on FIG. 5. Thus, if the coupling profiles of a series of masks were known, such as lines B-H of FIG. 5, then a coupling adjust spot could be plated on the ground side, with material being added until the coordinates intersected a predetermined coupling profile line. Thereafter, the frequency plate spots could be deposited upon the electrodes until the desired final frequency was obtained. This composite plating operation can be shown graphically by the broken path 54 indicated by arrowheads in FIG. 7. Therein, the frequency coordinates of the crystal prior to final frequency adjust are at 56. Curve 54 represents the change in coordinates caused by plating of a coupling adjust spot such as spot 52 of FIG. 6. When curve 54 intersects a predetermined coupling profile line J, representative of a particular mask, at point 58, plating of the coupling adjust spot is terminated and plating of the frequency plate spots is initiated. The coordinates follow path 60 as material is deposited until the desired frequencies are obtained at the origin.

As has already been mentioned, the frequency plate spots are plated onto the resonator electrodes through the open or exposed portion of a frequency plate mask. The mask is made of a non-conducting material and slides over the crystal wafer exposing portions of the resonator electrodes. In the past, shutter systems have been proposed which selectively expose the opening in the mask to the plating metal as it evaporates from its filament. We will now describe our improved binary shutter system which we have found particularly useful when used in combination with the frequency adjust method just described.

Basically, a shutter is a thin flat piece of metal attached to the plunger of a linear solenoid. When mounted in a typical plating fixture, it moves between two positions; one position in which it blocks the opening in the mask and another position in which it exposes the opening in the mask. The mask openings are typically circles or rectangles. As previously discussed, a particular mask has associated therewith a particular, generally linear, relationship between plateback and change in SPSF when applied to a particular location on a particular crystal. Theoretically, this allows the crystal frequency to be fine-tuned to the desired SPSF as the resonators are plated. In actuality, however, precise tuning is difficult to obtain with prior art systems because of tolerances in the wafer, the crystal base (element 32 of FIG. 2) and the masks themselves.

An available alternative method for plating crystal resonators uses a frequency plate mask on the front side of a crystal with an opening exposing each resonator electrode, and another mask with an opening exposing a coupling strip between the electrodes on the grounded side. Each resonator electrode is plated from a separate filament located in front of each electrode. A partition separates the two filaments from each other and extends to the front face of the wafer allowing each filament to plate only onto the electrode immediately in front of it. A third filament on the opposite (grounded) side of the crystal is used to plate onto the coupling strip. The power to each of the three filaments is turned on and off and adjusted in intensity to plate on the desired amount of metal. This system uses no shutters and is inadequate because of the tendency of the filaments to remain hot enough for the metal to continue to evaporate after the power is turned off.

Figures 9A, 9B:
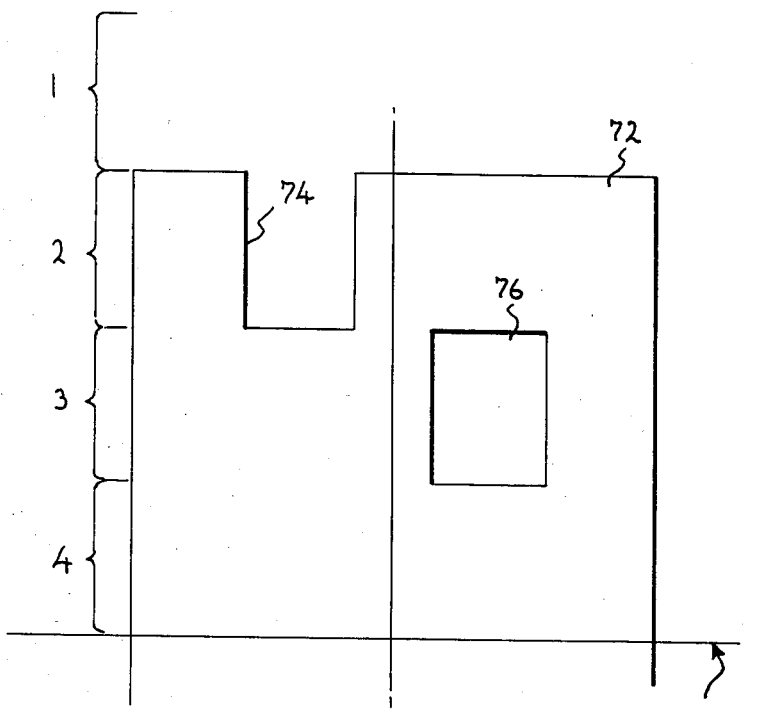
FIGS. 9A and 9B are alternative embodiments of FIGS. 8A and 8C, respectively.
Figure 10:
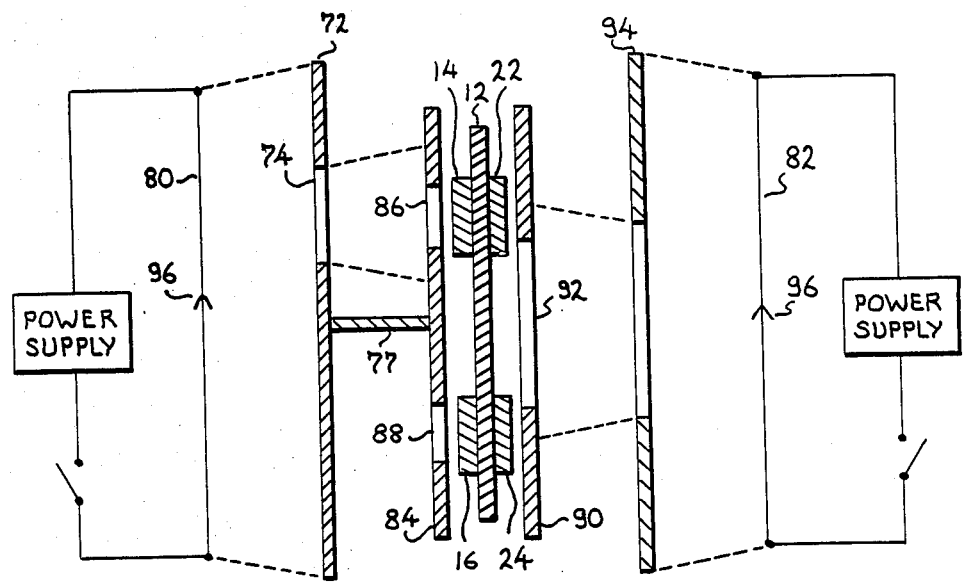
FIG. 10 is a schematic representation of a coupled dual resonator being plated using a binary shutter system.

We prefer a binary shutter system between a single filament and two openings in the frequency plate mask. This allows exposure of either or both openings during plating, as well as completely shutting off the deposition of metal when the desired frequency is obtained. A four-position shutter 72 is depicted in FIGS. 8A and 10, the shutter comprising a thin sheet of metal having generally rectangular openings 74, 76 therein. As shown, the openings are rectangular but may assume any other shape such as circular without departing from the scope of the present invention. The shutter is used in conjunction with the plating of a crystal wafer such as that depicted in FIG. 6 and which is reproduced in simplified form as FIG. 8B. Openings 74, 76 in the shutter are separated laterally and vertically such that they can expose their respective frequency electrodes 14, 16 only when in one of four positions. When the four position shutter is in position 1, it exposes both of the electrodes. As shown, in position 1 the shutter has been retracted sufficiently through the plating fixture surface so that neither resonator is blocked. This could also be accomplished with two laterally displaced rectangular openings in a vertically upward extension of shutter 72. Partition 77 extends from the frequency plating mask 84 to shutter 72 to prevent material passing through aperture 74 from being inadvertently deposited on the other resonator. When the shutter is in position 2 in front of the frequency plate mask openings, only one electrode (14) can be plated. In position 3, neither electrode can be plated because there are no apertures in the shutter associated with this vertical displacement. Finally, when the shutter is in position 4 in front of the frequency plate mask openings, only the other electrode 16 can be plated. A truth table for this shutter arrangement is shown in FIG. 8C, with resonator A being the one associated with electrode 14 and resonator B being associated with electrode 16. A key feature of this arrangement is that only one binary digit and only one opening is changed when the shutter sequences from one position to another. This provides for relatively easy electronic monitoring. An alternative embodiment which involves the changing of more than one binary digit when switching between positions 2 and 3 is shown in FIG. 9A. The associated truth table appears in FIG. 9B.

FIG. 10 is a schematic representation of the plating system including the novel shutter arrangement when viewed from above. This configuration provides for the plating of not only the frequency plate spots on the front or active side of the crystal, but also the previously discussed coupling adjust spot on the reverse or grounded side. A pair of filaments 80, 82 are disposed with one on each side of piezoelectric wafer 12. The wafer is provided with the usual electrodes 14, 22 forming an input resonator and electrodes 16, 24 forming an output resonator. Frequency plate mask 84 of nonconductive sheet material masks electrodes 14, 16 for the purpose of forming the frequency plate spots thereon through apertures 86, 88, respectively. Similarly, mask 90 is provided to form the coupling adjust spot through aperture 92. Between filament 80 and mask 84 is binary shutter 72 with its apertures 74, 76, only one of which is depicted because in this example the shutter is positioned such that only electrode 14 is exposed. Similarly, another shutter 94 is disposed between filament 82 and mask 90 to control the disposition of material through mask 90. Each filament is connected to a power supply which, when activated, causes the high grade silver elements 96 suspended on the filaments to evaporate into droplets which are propelled in all directions including toward wafer 12. If shutters 72 and 94 have their respective apertures aligned with their respective mask openings, some silver droplets (determined by the duration and magnitude of the power flow through the filaments) will be deposited on the electrodes and/or wafer surfaces to form the frequency plate spots and/or coupling adjust spot. In practice, we have found that good results are obtained when the masks are positioned within 1 to 4 mils of the wafer, the shutters are disposed 250 to 1000 mils from the masks and the filaments are 200 to 500 mils from the shutters.

The operation of shutter 72 working in conjunction with two-position shutter 94 allows for the functional adjustment of frequency and coupling (SPSF) in a dynamic mode as earlier described. Accordingly, mask 84 would be one of the set of masks producing profiles of the type illustrated in FIG. 5. The fact that both resonators can be plated simultaneously, or one resonator can be plated at a time, or both resonators can be completely masked out allows for extremely accurate frequency and coupling adjustment. Heretofore, available systems only permitted the adjustment of two of the three parameters comprising resonator A frequency, resonator B frequency or coupling. The arrangement of this invention permits the selective adjustment of all three parameters.

Figure 11A:
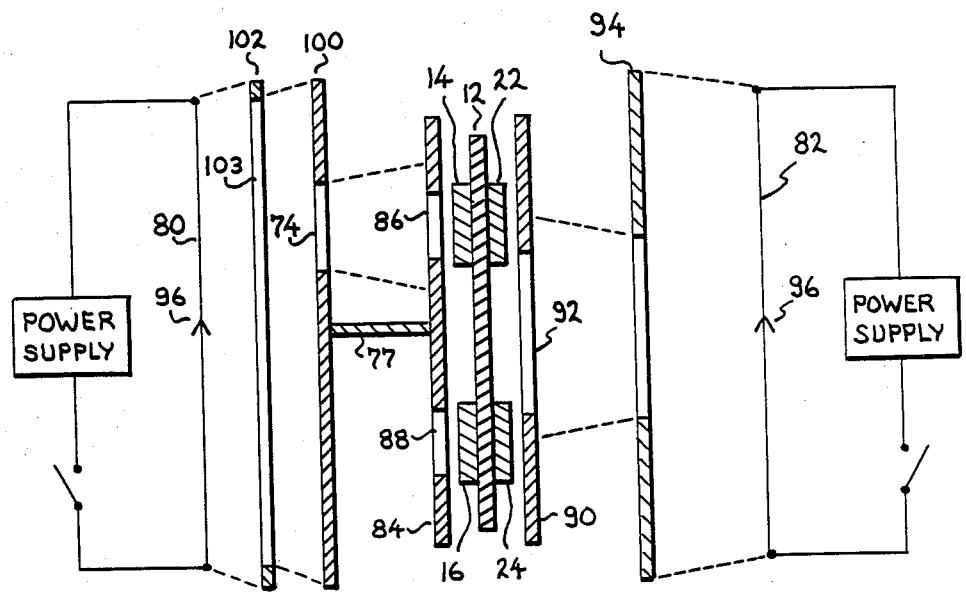
FIG. 11A is similar to FIG. 10 utilizing an alternative binary shutter system.

The specific system which we prefer in a four-peak plater (reference U.S. Pat. No. 4,093,914) for a 44970 KHz coupled-resonator crystal is a 3-position, 2 shutter system represented in FIG. 11A which is yet another embodiment of the present invention. Basically, a modified shutter 100 with only positions 2 and 4 from FIG. 8A is used to plate one resonator or the other. Between it and the filament 80 a second shutter 102 is positioned having a single aperture 103 which comprises an ON- OFF shutter, namely, positions 1 and 3 from FIG. 8A. This dual-shutter arrangement permits the plating of each resonator and even quicker cut-off of deposition, although at the expense of some small added system complexity. This arrangement has the particular advantage of assuring appropriate time for the search routine used in monitoring the crystal during plating. A truth table showing the operation of shutters 100 and 102 appears in FIG. 11B.

Yet another embodiment of the present invention employs a four position, two shutter system using the two shutters shown in FIG. 12A. The first shutter 104 has a single aperture 106 which aligns with the mask aperture for resonator A (electrode 14) and shutter 108 has a single aperture 110 which aligns with the mask aperture for resonator B (electrode 16). When the shutters 104, 108 are in their ON positions, they do not obstruct the deposition of material through the masks for either electrode, whereas in their OFF positions they mask resonators A and B, respectively. When both shutters are in their OFF positions, each blocking off one of the frequency plate mask openings, neither resonator can be plated and the equivalent of position 3 in FIG. 8A is obtained. When first shutter 104 is ON and second shutter 108 if OFF, the equivalent of position 4 in FIG. 8A is obtained and only one resonator (resonator B) is plated. If first shutter 104 is OFF and second shutter 108 is ON, the equivalent of position 2 in FIG. 10A is achieved and the other resonator (resonator A) is plated. This four position, two shutter system in front of the crystal tracks the binary operation of the single shutter of FIG. 10A except that it has the added benefit of being able to turn off the plating at any time if required. Again, this dual shutter arrangement can be used for adjusting frequency on the front side of the coupled-dual crystal in conjunction with a single ON-OFF shutter (shutter 94 of FIG. 10) controlling plating of the coupling adjust spot on the ground side. Such a system can provide extremely accurate functional adjustment of the two resonator frequencies and synchronous peak separation frequency.

It should become obvious to one skilled in the art that certain changes can be made to the above-described invention without departing from the broad inventive concepts thereof. For example, whereas the present invention has been described with particular reference to final frequency plating of coupled-dual resonator crystals, the invention is equally adaptable to any vapor deposition process, including those associated with the manufacture of semiconductor chips, thin film resistors, optical films and the like. Furthermore, while the illustrated embodiment uses vertically sliding shutters, horizontally sliding shutters would work in the same manner. It is intended that the appended claims cover these and all other such variations in the present invention's broader inventive concepts.

Having thus described the invention, what is claimed as novel and desired to be secured by Letters Patent of the United States is:

1. Shutter apparatus for use in tuning resonator crystals or the like by the vapor deposition process in which a material is plated on both the active and ground sides of a crystal through masks associated with each side of the crystal, the shutter apparatus comprising:
   a first sliding shutter disposed between a first deposition material source and an active side mask having a plurality of apertures equal to the number of areas to be plated on the active side of the crystal, said first sliding shutter having a plurality of apertures equal to the number of active side mask apertures, each first shutter aperture being separated laterally and vertically from the other first shutter apertures, said first sliding shutter being movable to a number of positions equal to the number of first shutter apertures, and wherein at each position only one first shutter aperture is aligned with one active side mask aperture;
   a second sliding shutter disposed between said first deposition material source and said active side mask, said second sliding shutter being movable to two positions, a first position at which said second sliding shutter blocks the flow of deposition material to said active side mask regardless of the position of said first sliding shutter, and a second position at which said second sliding shutter does not interfere with the flow of deposition material through said first sliding shutter apertures regardless of the position of said first sliding shutter;
   means attached to said first and second sliding shutters for moving said shutters sequentially from one position to another;
   a third sliding shutter disposed between a second deposition material source and a ground side mask having a coupling adjust spot aperture therein, said third sliding shutter having an aperture therethrough in substantial alignment with said coupling adjust spot aperture when said third sliding shutter is in a first position and in complete misalignment with said coupling adjust spot aperture when said third sliding shutter is in a second position; and
   means attached to said third sliding shutter for sliding said shutter between its first and second positions.

2. The shutter apparatus of claim 1 wherein said second sliding shutter is disposed between said first deposition material source and said first sliding shutter.

3. The shutter apparatus of claim 1 wherein in said first position said third sliding shutter aperture is superimposed between and partially shadows each of said active side mask apertures on the active side of the crystal.

4. Shutter apparatus for use in tuning resonator crystals or the like by the vapor deposition process in which a material is deposited onto the active side of a crystal through a first mask having first and second apertures therethrough for depositing material on two areas of the active side, the shutter apparatus comprising:
   a first sliding shutter disposed between a first vapor source and said first mask, said first sliding shutter having a third aperture therethrough and being movable between two positions, an "off" position at which said third aperture is in substantial alignment with said first aperture to permit the flow of deposition material therethrough while blocking the flow of deposition material through said second aperture, and an "on" position at which said first sliding shutter does not interfere with the flow of deposition material to either of said first mask apertures;
   a second sliding shutter disposed between said first sliding shutter and said first mask, said second sliding shutter having a fourth aperture therethrough and being movable between two positions, an "off" position at which said fourth aperture is in substantial alignment with said second aperture to permit the flow of deposition material therethrough while blocking the flow of deposition material through said first aperture, and an "on" position at which said second sliding shutter does not interfere with the flow of deposition material to either of the first mask apertures; and means attached to said first and second sliding shutters for moving each of said shutters between its "on" and "off" positions whereby, when both shutters are in their "on" positions the flow of deposition material through both mask apertures is unimpeded, when both shutters are in their "off" positions the flow of deposition material through both mask apertures is blocked, when said first sliding shutter is in its "on" position and said second sliding shutter is in its "off" position the flow of deposition material through said first aperture is blocked and through said second aperture is unimpeded, and when said first sliding shutter is in its "off" position and said second sliding shutter is in its "on" position the flow of deposition material through said first aperture is unimpeded and though said second aperture is blocked.

5. Shutter apparatus for use in tuning a resonator crystal or the like by a process in which a vaporized material flows through a first mask having first and second apertures therethrough for plating two laterally spaced apart areas on the active side of the crystal, the shutter apparatus comprising:

first and second parallel overlaying sliding shutters disposed between a first vapor source and said first mask, each shutter having a shutter aperture therethrough and being movable to an "off" position where its shutter aperture is in substantial alignment with one of said mask apertures to permit the flow of vaporized material therethrough while blocking the flow of vaporized material through the other mask aperture, and an "on" position where the flow of vaporized material through neither mask aperture is blocked, the two shutter apertures being associated with different ones of said mask apertures; and means attached to said first and second overlaying sliding shutters for moving each of said shutters between its "on" and "off" positions whereby the combination of "on" and "off" positions blocks the flow of vaporized material through either one, both or neither of said mask apertures.

6. The shutter apparatus of claim 5 further comprising:

a third sliding shutter disposed between a second vapor source and a ground side mask having a coupling adjust spot aperture therethrough for plating material from the second vapor source onto a ground side of the crystal, said third sliding shutter being movable between two positions and having an aperture therethrough in substantial alignment with said coupling adjust spot aperture to permit the flow of vaporized material from said second source therethrough when said third sliding shutter is in its first position and wherein said third shutter aperture is in complete misalignment with said coupling adjust spot aperture so that said third shutter blocks the flow of vaporized material from said second source therethrough when said third sliding shutter is in its second position; and means attached to said third sliding shutter for moving said third shutter between its first and second positions.

7. The shutter of claim 6 wherein in its first position said third sliding shutter aperture is substantially aligned between and partially shadows the two laterally spaced apart areas on the active side of the crystal.

8. Shutter apparatus for use in tuning a resonator crystal by a process in which a vaporized material is plated onto two laterally spaced apart areas on the active side of the crystal through a first mask having first and second apertures to permit the passage therethrough of the vaporized material onto said areas, the shutter apparatus comprising:

a first sliding shutter disposed between a first vapor source and said first mask for either blocking or permitting the flow of vaporized material through said mask apertures, said first sliding shutter comprising a thin plate having two laterally and vertically spaced apart apertures therethrough, said first sliding shutter being movable between four positions; a first position in which said first shutter permits the flow of vaporized material through said mask apertures; a second position in which one of said shutter apertures is substantially aligned with the first of said first mask apertures to permit the flow of vaporized material therethrough, but in which the other first shutter aperture is not aligned with the second of said first mask apertures, thereby blocking the flow of vaporized material therethrough; a third position in which the other of said first shutter apertures is substantially aligned with the second of said first mask apertures to permit the flow of vaporized material therethrough, but in which the one first shutter aperture is not aligned with the first of said first mask apertures, thereby blocking the flow of vaporized material therethrough; and a fourth position in which neither first shutter aperture is aligned with either mask aperture thereby blocking the flow of vaporized material through said mask apertures; and means attached to said first sliding shutter for moving said shutter sequentially through its four positions whereby either one, both or neither of the mask apertures are exposed to the flow of vaporized material.

9. The shutter apparatus of claim 8 further comprising:

a second sliding shutter disposed between a second vapor source and a ground side mask having a coupling adjust spot aperture therethrough for plating metal from the second vapor source onto a ground side of the crystal, said second sliding shutter being movable between two positions and having an aperture therethrough in substantial alignment with said coupling adjust spot aperture to permit the flow of vaporized material from said second source therethrough when said second sliding shutter is in its first position and wherein said second shutter blocks the flow of vaporized material through said coupling adjust spot aperture when said second sliding shutter is in its second position; and means attached to said second sliding shutter for moving said second shutter between its first and second positions.

10. Four-position shutter apparatus for use in plating a resonator crystal or the like by a process in which a vaporized material from a first vapor source is plated onto two laterally spaced apart areas on a first side of the resonator crystal through a first mask having first and second apertures to permit the passage therethrough of the vaporized material onto selected ones of said areas, said apparatus comprising: first sliding plate means between said first mask and a first vapor source for sequentially exposing either one, both or neither of said mask apertures to the vaporized material to thereby plate either, both or neither of said areas, said first sliding plate means including two laterally and vertically spaced apart shutter apertures each shutter aperture being associated with only one of said mask apertures and alignable therewith in only one of said four positions; and means attached to said first sliding plate means for sequentially positioning said first sliding plate means between its four positions with respect to said first mask apertures.

11. The shutter apparatus of claim 10 further comprising:

second sliding plate means disposed between a second vapor source and a second mask having a coupling adjust spot aperture therethrough for depositing material from the second vapor source onto a second side of the crystal, said second sliding plate means being movable between two positions and having an aperture therethrough in substantial alignment with said coupling adjust spot aperture to permit the flow of vaporized material from said second source therethrough when said second sliding plate means is in its first position and wherein said second sliding plate means blocks the flow of vaporized material through said coupling adjust spot aperture when said second sliding plate means is in its second position; and means attached to said second sliding plate means for moving said second sliding plate means between its first and second positions.

12. The shutter apparatus of claim 11 wherein in its first position said second sliding shutter aperture is substantially aligned between and partially shadows the two laterally spaced apart areas on the first side.

13. The shutter apparatus of claim 10 in which said first sliding plate means comprises:

a first sliding shutter disposed between said first vapor source and said first mask having two mask apertures therein associated with two areas to be plated on the first side of the crystal, said first sliding shutter having said two shutter apertures therein, said first sliding shutter being movable between either of two positions at which only one first shutter aperture is aligned with only one first mask aperture; and a second sliding shutter disposed between said first sliding shutter and said first mask, said second sliding shutter being movable between two positions, a first position at which said second sliding shutter blocks the flow of vaporized material to said first mask regardless of the position of said first sliding shutter, and a second position at which said second sliding shutter does not interfere with the flow of vaporized material through said first sliding shutter apertures; and wherein said positioning means is attached to said first and second sliding shutters for moving each of said shutters between its two positions whereby the combination of positions blocks the flow of vaporized material through either, both or neither of said first mask apertures.

* * * * *